US012253872B2

United States Patent
Jin

(10) Patent No.: US 12,253,872 B2
(45) Date of Patent: Mar. 18, 2025

(54) VOLTAGE ADJUSTMENT APPARATUS, CHIP, POWER SOURCE, AND ELECTRONIC DEVICE

(71) Applicant: Chipone Technology (Beijing) Co., LTD., Beijing (CN)

(72) Inventor: Ning Jin, Beijing (CN)

(73) Assignee: Chipone Technology (Beijing) Co., LTD., Beijing (CN)

( * ) Notice: Subject to any disclaimer, the term of this patent is extended or adjusted under 35 U.S.C. 154(b) by 181 days.

(21) Appl. No.: 17/944,256

(22) Filed: Sep. 14, 2022

(65) Prior Publication Data

US 2023/0016715 A1 Jan. 19, 2023

Related U.S. Application Data

(63) Continuation of application No. PCT/CN2021/091054, filed on Apr. 29, 2021.

(51) Int. Cl.
*G05F 1/595* (2006.01)
*G01R 19/25* (2006.01)
*G05F 1/46* (2006.01)

(52) U.S. Cl.
CPC ......... *G05F 1/595* (2013.01); *G01R 19/2506* (2013.01); *G05F 1/462* (2013.01)

(58) Field of Classification Search
CPC ..... G05F 1/00; G05F 1/40; G05F 1/46; G05F 1/461; G05F 1/462; G05F 1/467; G05F 1/56; G05F 1/561; G05F 1/562; G05F 1/563; G05F 1/565; G05F 1/575; G05F 1/59; G05F 1/595; G05F 1/62; G01R 19/25; G01R 19/2506; G01R 19/2509;
(Continued)

(56) References Cited

U.S. PATENT DOCUMENTS 10,291,125 B2 5/2019 Raval et al.
10,389,248 B1 8/2019 Park et al.
(Continued)

FOREIGN PATENT DOCUMENTS

CN 101034848 A 9/2007
CN 103580478 A 2/2014
(Continued)

OTHER PUBLICATIONS

English translation of CN-106787626-A. (Year: 2017).*
International Search Report, Jul. 30, 2021 (5 Pages).

*Primary Examiner* — Thienvu V Tran
*Assistant Examiner* — Carlos O Rivera-Perez
(74) *Attorney, Agent, or Firm* — Occhiuti & Rohlicek LLP

(57) ABSTRACT

A voltage adjustment apparatus, a chip, a power source, and an electronic device. The apparatus comprises: a voltage input module, used for receiving an input voltage; a current determining module, electrically connected to the voltage input module and used for determining an adjustment current on the basis of the input voltage and a load current; a control module, electrically connected to the current determining module and used for outputting a control signal on the basis of the adjustment current; and a voltage output module, electrically connected to the voltage input module, the current determining module, and the control module, and being used for outputting a target voltage on the basis of the control signal and the input voltage.

8 Claims, 5 Drawing Sheets

(58) Field of Classification Search
CPC ....... G01R 19/165; G01R 15/04; H02M 3/00;
H02M 3/02; H02M 3/04; H02M 3/10;
H02M 3/135; H02M 3/137; H02M 3/139;
H02M 3/142; H02M 3/145; H02M 3/155;
H02M 3/1552; H02M 3/156; H02M
3/1563; H02M 3/1566; H02M 3/157;
H02M 3/158; H02M 3/1582; H02M
3/1588; H02M 1/0003; H02M 1/0009;
H02M 1/0012; H02M 1/0016; H02M
1/0019; H02M 1/0022; H02M 1/0025;
H02M 1/0029; H02M 1/14; H02M 1/143;
Y02B 20/30
USPC ........ 323/222–226, 234, 266, 269–275, 277,
323/278, 280, 282–286, 288, 299–303,
323/304, 311–317, 351; 327/131–140,
327/538–543
See application file for complete search history.

(56) References Cited

U.S. PATENT DOCUMENTS

| | | | |
|---|---|---|---|
| 10,958,167 B2* | 3/2021 | Price | H03F 3/45475 |
| 2011/0109291 A1 | 5/2011 | Tang et al. | |
| 2012/0194161 A1 | 8/2012 | Latham et al. | |
| 2020/0099306 A1 | 3/2020 | Kanbara et al. | |
| 2020/0106357 A1* | 4/2020 | Wiersch | H02M 3/158 |
| 2022/0247354 A1* | 8/2022 | Hu | H03K 4/502 |

FOREIGN PATENT DOCUMENTS

| | | | | |
|---|---|---|---|---|
| CN | 106329924 A | | 1/2017 | |
| CN | 106787626 A | * | 5/2017 | H02M 1/00 |
| CN | 110518799 A | | 11/2019 | |
| CN | 111596715 A | | 8/2020 | |
| CN | 111596716 A | | 8/2020 | |
| KR | 20090090665 A | | 8/2009 | |

* cited by examiner

VOLTAGE ADJUSTMENT APPARATUS, CHIP, POWER SOURCE, AND ELECTRONIC DEVICE

This present application is a continuation of and claims priority under 35 U.S.C. 120 to PCT application No. PCT/CN2021/091054 filed on Apr. 29, 2021, which claims priority to Chinese patent application No. 202010475300.0 filed on May 29, 2020 and entitled "VOLTAGE ADJUSTMENT APPARATUS, CHIP, POWER SOURCE, AND ELECTRONIC DEVICE". All the above are incorporated herein by reference.

TECHNICAL FIELD

The present disclosure relates to the technical field of integrated circuits, and in particular, to a voltage adjustment apparatus, a chip, a power source, and an electronic device.

BACKGROUND

In the power drive management chip of an Active-Matrix Organic Light-Emitting Diode (AMOLED), there is such a Time Division Multiple Access (TDMA) test requirement. The input power source will be disturbed at intervals, jumping up or down by 500 mV within 10 μs, and the 500 mV jump will last for at least 500 μs. If such disturbance occurs, there must be overshoot or undershoot for the output of the Boost architecture in DC-DC transformation, and such disturbance is required to be less than 20 mV for a load within 200 mA, and less than 60 mV for a load within 1 A.

However, in the related art, when the input power source is disturbed, changes cannot be tracked quickly, which often leads to disturbances such as overshoot and undershoot of the output voltage, resulting in unstable output voltage.

SUMMARY

In view of this, the present disclosure proposes a voltage regulating apparatus, comprising:

a voltage input module, configured to receive an input voltage;

a current determination module, electrically connected to the voltage input module, and configured to determine an adjustment current based on the input voltage and a load current;

a control module, electrically connected to the current determination module, and configured to output a control signal based on the adjustment current; and a voltage output module, electrically connected to the voltage input module, the current determination module and the control module, and configured to output a target voltage based on the control signal and the input voltage.

In a possible embodiment, the current determination module comprises a current detection unit, a signal conversion unit, and a current determination unit, wherein:

the current detection unit is configured to determine the load current, and obtain a detection voltage based on the load current, the signal conversion unit is electrically connected to the current detection unit and is configured to convert the detection voltage into a digital signal, and the current determination unit is electrically connected to the signal conversion unit and is configured to determine the adjustment current based on the digital signal and the input voltage.

In a possible embodiment, the current determination unit comprises a first operational amplifier, a first transistor, a second transistor, a third transistor, a fourth transistor, a plurality of fifth transistors, a plurality of switches, and a first resistor, wherein:

a positive input terminal of the first operational amplifier is used to receive the input voltage, a negative input terminal of the first operational amplifier is electrically connected to a source of the first transistor and a first terminal of the first resistor, an output terminal of the first operational amplifier is electrically connected to a gate of the first transistor, and a second terminal of the first resistor is grounded, a drain of the first transistor is electrically connected to a source of the second transistor, a gate of the second transistor, and a gate of the third transistor, a drain of the second transistor and a drain of the third transistor are used to receive a power voltage, a source of the third transistor is electrically connected to a drain of the fourth transistor, a gate of the fourth transistor, and gates of the plurality of fifth transistors, a source of the fourth transistor and sources of the plurality of fifth transistors are grounded, a drain of each of the plurality of fifth transistors is respectively electrically connected to a first terminal of corresponding one of the plurality of switches, and a control terminal of each of the plurality of switches is used to receive the digital signal, and is turned on or off according to the digital signal, and second terminals of each of the plurality of switches are electrically connected, and are used to output the adjustment current.

In a possible embodiment, the number of bits of the digital signal is the same as the number of the switches, and each bit of the digital signal is used to control a conduction state of corresponding one of the plurality of switches.

In a possible embodiment, the current detection unit comprises a sixth transistor, a seventh transistor, a second operational amplifier, a second resistor, and a first capacitor, wherein:

a gate of the sixth transistor is used to receive the control signal, a drain of the sixth transistor is electrically connected to the voltage input module, and a source of the sixth transistor is electrically connected to a positive input terminal of the second operational amplifier and a drain of the seventh transistor, a negative input terminal of the second operational amplifier is electrically connected to the voltage output module, an output terminal of the second operational amplifier is electrically connected to a gate of the seventh transistor, and a source of the seventh transistor is electrically connected to a first terminal of the second resistor and a first terminal of the first capacitor, a second terminal of the second resistor and a second terminal of the first capacitor are grounded, and the first terminal of the second resistor is used to output the detection voltage.

In a possible embodiment, the voltage output module comprises an eighth transistor, a ninth transistor, a tenth transistor, an eleventh transistor, a third operational amplifier, a third resistor, a fourth resistor, and a second capacitor, wherein:

a gate of the eighth transistor is electrically connected to the gate of the sixth transistor, a gate of the tenth transistor, and the control module, and is used to receive the control signal, a drain of the eighth transistor is electrically connected to a drain of the ninth transistor, the drain of the sixth transistor, a drain of the tenth transistor, and the voltage input module, a source of the eighth transistor is electrically connected to a negative input terminal of the third operational amplifier, the negative input terminal of the second operational amplifier, a first terminal of the third resistor, and a first terminal of the second capacitor, a second terminal of the third resistor is electrically connected to the control module and a first terminal of the fourth resistor, a second terminal of the fourth resistor is grounded, and a second terminal of the second capacitor is grounded, a gate of the ninth transistor is electrically connected to the control module and is used to receive the control signal, and a source of the ninth transistor is grounded, a positive input terminal of the third operational amplifier is electrically connected to a source of the tenth transistor and a drain of the eleventh transistor, and an output terminal of the third operational amplifier is electrically connected to a gate of the eleventh transistor, a source of the eleventh transistor is electrically connected to the current determination module and the control module, and the first terminal of the third resistor is used to output the target voltage.

In a possible embodiment, the voltage input module comprises an input capacitor and an input inductor, wherein:

a first terminal of the input capacitor is electrically connected to a first terminal of the input inductor and is used to receive the input voltage, and a second terminal of the input capacitor is grounded, and a second terminal of the input inductor is electrically connected to the drain of the ninth transistor, the drain of the eighth transistor, the drain of the sixth transistor, and the drain of the tenth transistor.

According to an aspect of the present disclosure, there is provided a chip comprising the voltage regulating apparatus.

According to an aspect of the present disclosure, there is provided a power source comprising the chip.

According to an aspect of the present disclosure, there is provided an electronic device comprising the power source.

In a possible embodiment, the electronic device includes a display, a smartphone and a portable device.

Through the above apparatus in the embodiment of the present disclosure, the current determination module determines the adjustment current based on the input voltage and the load current. As long as the input voltage changes, the current determination module can respond quickly, generate the adjustment current in combination with the load current, and output the adjustment current to the control module to generate the control signal. The voltage output module can output a stable target voltage based on the control signal, without excessive overshoot and undershoot, and can achieve stable voltage output under different load conditions. The voltage regulating apparatus proposed according to the present disclosure can output a stable target voltage and respond quickly to changes of the input voltage, which has the characteristics of reliability, stability, and a high environmental adaptability of adapting to different load applications.

Other features and aspects of the present disclosure will become apparent from the following detailed description of exemplary embodiments with reference to the accompanying drawings.

BRIEF DESCRIPTION OF THE DRAWINGS

The accompanying drawings, which are incorporated in and constitute a part of the specification, illustrate exemplary embodiments, features, and aspects of the present disclosure, together with the description, and serve to explain the principles of the present disclosure.

DETAILED DESCRIPTION

Figure 1:
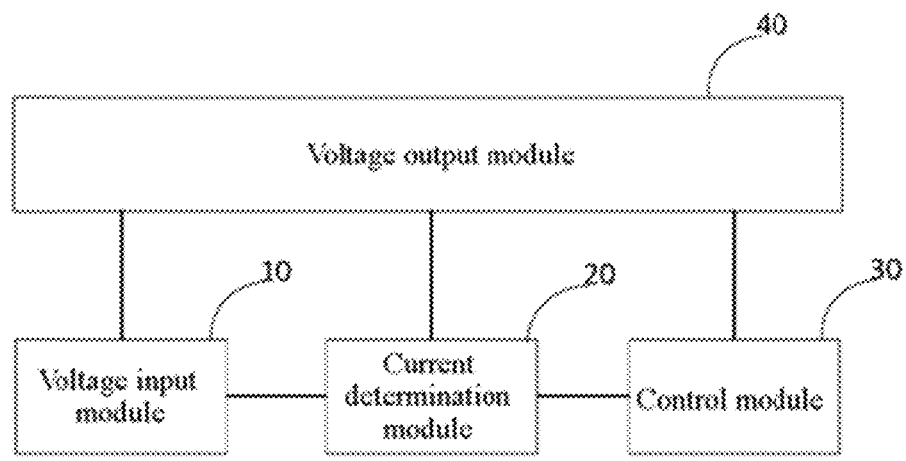
FIG. 1 shows a schematic diagram of a voltage regulating apparatus according to an embodiment of the present disclosure.

Various exemplary embodiments, features and aspects of the present disclosure will be described in detail below with reference to the accompanying drawings. The same reference numerals in the drawings denote elements with the same or similar functions. While various aspects of the embodiments are shown in the drawings, the drawings are not necessary to be drawn to scale unless otherwise indicated.

The word "exemplary" used exclusively herein means "used as an example, embodiment, or illustrative." Any embodiment described herein as "exemplary" is not necessary to be construed as superior to or better than other embodiments.

In addition, in order to better illustrate the present disclosure, numerous specific details are given in the following detailed description. It should be understood by those skilled in the art that the present disclosure may be practiced without certain specific details. In some instances, methods, means, elements and circuits well known to those skilled in the art will not be described in detail so as to highlight the gist of the present disclosure.

Please refer to FIG. 1, which shows a schematic diagram of a voltage regulating apparatus according to an embodiment of the present disclosure.

As shown in FIG. 1, the apparatus includes:

a voltage input module 10, configured to receive an input voltage;

a current determination module 20, electrically connected to the voltage input module 10, and configured to determine an adjustment current based on the input voltage and a load current;

a control module 30, electrically connected to the current determination module 20, and configured to output a control signal based on the adjustment current; and a voltage output module 40, electrically connected to the voltage input module 10, the current determination module 20, and the control module 30, and configured to output a target voltage based on the control signal and the input voltage.

Through the above apparatus in the embodiment of the present disclosure, the current determination module determines the adjustment current based on the input voltage and the load current. When the input voltage changes, the current determination module can respond quickly, generate the adjustment current in combination with the load current, and output the adjustment current to the control module to generate the control signal. The voltage output module can output a stable target voltage based on the control signal, without excessive overshoot and undershoot, and can achieve stable voltage output under different load conditions. The voltage regulating apparatus proposed according to the present disclosure can output a stable target voltage and respond quickly to changes of the input voltage, which has the characteristics of reliability, stability, and a high environmental adaptability of adapting to different load applications.

The voltage regulating apparatus proposed in the present disclosure may include a DC-DC conversion circuit (direct current to direct current conversion circuit), and may output a stable and reliable target voltage based on the input DC voltage.

Figure 2:
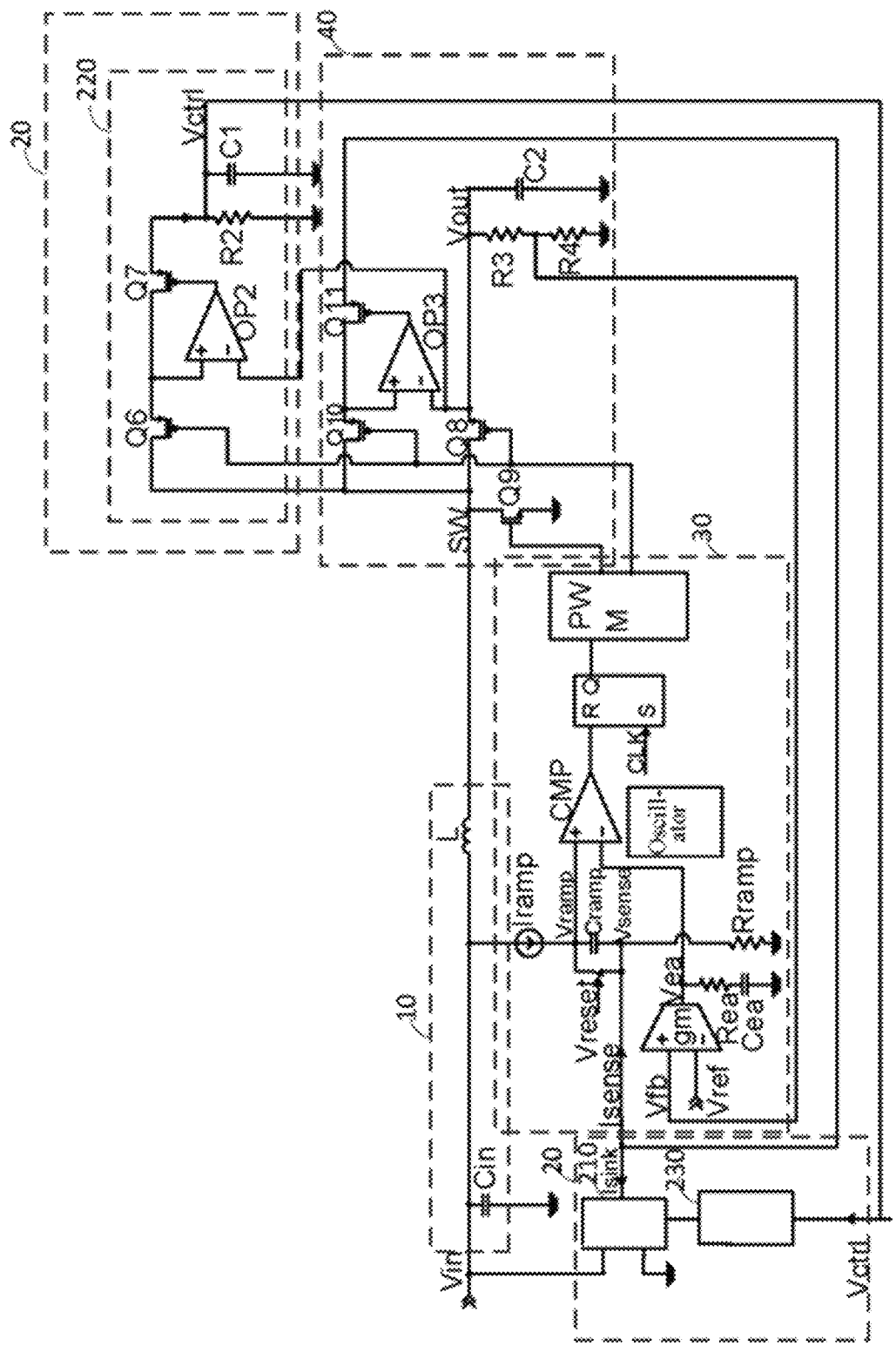
FIG. 2 shows a schematic diagram of a voltage regulating apparatus according to an embodiment of the present disclosure.

Please refer to FIG. 2, which shows a schematic diagram of a voltage regulating apparatus according to an embodiment of the present disclosure.

In a possible embodiment, as shown in FIG. 2, the current determination module 20 may include a current detection unit 220, a signal conversion unit 230, and a current determination unit 210, wherein:

the current detection unit 220 is configured to determine the load current, and obtain a detection voltage based on the load current, the signal conversion unit 230 is electrically connected to the current detection unit 220 and is configured to convert the detection voltage into a digital signal; and the current determination unit 210 is electrically connected to the signal conversion unit 230 and is configured to determine the adjustment current Isink based on the digital signal and the input voltage.

In FIG. 2, the current determination unit 210 can be abbreviated as CDU, and the signal conversion unit 230 can be abbreviated as SCU.

Figure 3:
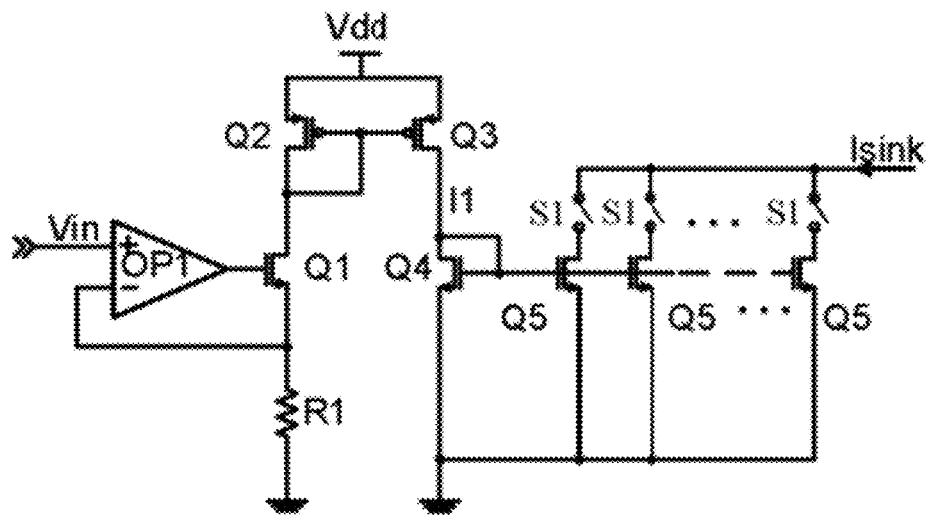
FIG. 3 shows a schematic diagram of a current determination unit according to an embodiment of the present disclosure.

Please also refer to FIG. 3, which shows a schematic diagram of a current determination unit according to an embodiment of the present disclosure.

In a possible embodiment, as shown in FIG. 3, the current determination unit may include a first operational amplifier OP1, a first transistor Q1, a second transistor Q2, a third transistor Q3, a fourth transistor Q4, a plurality of fifth transistors Q5, a plurality of switches S1, and a first resistor R1, wherein:

a positive input terminal of the first operational amplifier OP1 is used to receive the input voltage Vin, a negative input terminal of the first operational amplifier OP1 is electrically connected to a source of the first transistor Q1 and a first terminal of the first resistor, an output terminal of the first operational amplifier OP1 is electrically connected to a gate of the first transistor Q1, and a second terminal of the first resistor R1 is grounded, a drain of the first transistor Q1 is electrically connected to a source of the second transistor Q2, a gate of the second transistor Q2 and a gate of the third transistor Q3, a drain of the second transistor Q2 and a drain of the third transistor Q3 are used to receive a power voltage Vdd, a source of the third transistor Q3 is electrically connected to a drain of the fourth transistor Q4, a gate of the fourth transistor Q4, and gates of the plurality of fifth transistors $Q^5$, a source of the fourth transistor Q4 and sources of the plurality of fifth transistors Q5 are grounded, a drain of each of the plurality of fifth transistors Q5 is electrically connected to a first terminal of corresponding one of the plurality of switches S1, and a control terminal of each of the plurality of switches S1 is used to receive the digital signal, and is turned on or off based on the digital signal, and second terminals of each of the plurality of switches S1 are electrically connected, and are used to output the adjustment current Isink.

Through the above apparatus in the embodiment of the present disclosure, the current determination unit responds to the change of the input voltage and determines the adjustment current Isink in combination with the digital signal obtained based on the load current, so as to compensate for the change of the input voltage and generate a control signal, so that the output voltage is stable, the fluctuation of the output voltage is reduced when the input voltage changes, and the environmental adaptability of the apparatus is improved.

It should be noted that, the number of fifth transistors and the number of switches are not limited in the embodiment of the present disclosure, which may be selected by those skilled in the art as required. In one example, the number of fifth transistors may be the same as the number of switches, and the connection relationship between the drain of each of the fifth transistors and the control module is controlled by the corresponding switch. The type and specific implementation of the switch are not limited in the embodiment of the present disclosure. In one example, the switch S1 may be a transistor, a Single Pole Single Throw (SPST) switch, or the like.

The above apparatus in the embodiment of the present disclosure can quickly respond to the change of the input voltage when the input voltage changes and determine the adjustment current in combination with the load current, to compensate for the input of the control module, thereby reducing the fluctuation of the output voltage and adapting to different load environments to improve environmental adaptability.

Please continue to refer to FIG. 2. In a possible embodiment, as shown in FIG. 2, the current detection unit 220 may include a sixth transistor Q6, a seventh transistor Q7, a second operational amplifier OP2, a second resistor R2, and a first capacitor C1, wherein:

a gate of the sixth transistor Q6 is used to receive the control signal, a drain of the sixth transistor Q6 is electrically connected to the voltage input module, and a source of the sixth transistor Q6 is electrically connected to a positive input terminal of the second operational amplifier OP2 and a drain of the seventh transistor Q7, a negative input terminal of the second operational amplifier OP2 is electrically connected to the voltage output module, an output terminal of the second operational amplifier OP2 is electrically connected to a gate of the seventh transistor Q7, and a source of the seventh transistor Q7 is electrically connected to a first terminal of the second resistor R2 and a first terminal of the first capacitor C1, a second terminal of the second resistor R2 and a second terminal of the first capacitor C1 are grounded, and the first terminal of the second resistor R2 is used to output the detection voltage Vctrl.

Through the above apparatus in the embodiment of the present disclosure, the current detection unit can implement the detection of the load current, determine the detection voltage based on the detected load current, and determine a second adjustment current based on the detection voltage, so that the change of the load terminal can be compensated, thereby realizing the control of the control signal based on different load conditions.

In one example, in the detection, the current detection unit may average the current of the eighth transistor by (1-D)T*IL, so as to obtain the detection voltage Vtrcl=(1-D)T*IL*R, where D represents a duty cycle, T represents a clock period, IL represents an inductance of an input inductor L, and R represents the resistance value of the second resistor R2.

The current detection unit may convert the value of the load current into the detection voltage Vctrl=α*Id, where a represents a preset parameter, and Id represents the load current.

The above apparatus in the embodiment of the present disclosure can implement quick response to the input voltage and provide compensation for different loads. Therefore, the apparatus can adapt to various loads and the environmental adaptability thereof is improved.

In a possible embodiment, the signal conversion unit 230 may be implemented by a dedicated hardware circuit, or may be implemented by an existing hardware circuit.

In one example, the signal conversion unit may be implemented by a digital circuit. For example, the signal conversion unit 230 may be configured as a state machine including a register and a logic circuit, or may be implemented by a digital-to-analog converter. The specific implementation of the signal conversion unit 230 is not limited in the embodiment of the present disclosure.

In a possible embodiment, the number of bits of the digital signal is the same as the number of the switches, and each bit of the digital signal is used to control a conduction state of the corresponding switch. The digital signal obtained through the load current may be used as the control signal of a plurality of switches, and the output terminal of the signal conversion unit 230 may be electrically connected to the control terminal of each switch, so as to realize the control of each switch based on the digital signal.

In one example, when receiving the detection voltage Vctrl output by the current detection unit 220, the signal conversion unit 230 may perform signal conversion on the detection voltage Vctrl to convert the detection voltage Vctrl into a digital signal Dctrl<X:0>, wherein X represents the highest bit of the digital signal, and X+1 may be equal to the number of switches in the current determination unit.

In one example, for different load currents, different digital signals may be determined. Therefore, the conduction conditions of switches in the current determination unit are different, and the current determination unit may output a corresponding adjustment current based on the load current. For example, as the load current increases, the greater the number of switches controlled by the digital signal, the greater the adjustment current output by the current determination unit is, thus compensating for or regulating the input of the control module is realized, so that the voltage output by the voltage output module under the control of the control module remains stable.

In one example, the conversion parameters (e.g., the number of bits of the digital signal) of the signal conversion unit 230 may be configured according to the number of switches. When the circuit is working, the signal conversion unit 230 may obtain the digital signal based on the configured conversion parameters and the input detection voltage Vctrl, so as to control the conduction state of each switch.

In one example, the signal conversion unit 230 may also be configured to automatically read the parameter information (e.g., the number of switches) of the current determination unit, and to configure the conversion parameters (e.g., the number of bits of the digital signal) according to the number of switches. When the detection voltage Vctrl is received, the digital signal can be obtained based on the conversion parameters and the input detection voltage Vctrl, so as to control the conduction state of each switch.

Through the above apparatus, the signal conversion unit of the embodiment of the present disclosure can determine the magnitude of the adjustment current based on the detection voltage output by the current detection unit, so that the apparatus can quickly respond to the change of the input voltage and adapt to various load conditions as well. Under different load conditions, the fluctuation of the output voltage can be reduced when the input voltage changes, so that the output voltage remains stable.

In a possible embodiment, as shown in FIG. 2, the voltage output module 40 may include an eighth transistor Q8, a ninth transistor Q9, a tenth transistor Q10, an eleventh transistor Q11, a third operational amplifier OP3, a third resistor R3, a fourth resistor R4, and a second capacitor C2, wherein:

a gate of the eighth transistor Q8 is electrically connected to the gate of the sixth transistor Q6, a gate of the tenth transistor Q10, and the control module, and is used to receive the control signal, a drain of the eighth transistor Q8 is electrically connected to a drain of the ninth transistor Q9, the drain of the sixth transistor Q6, a drain of the tenth transistor Q10, and the voltage input module, a source of the eighth transistor Q8 is electrically connected to a negative input terminal of the third operational amplifier OP3, the negative input terminal of the second operational amplifier OP2, a first terminal of the third resistor R3, and a first terminal of the second capacitor C2, a second terminal of the third resistor R3 is electrically connected to the control module and a first terminal of the fourth resistor R4, a second terminal of the fourth resistor R4 is grounded, and a second terminal of the second capacitor C2 is grounded, a gate of the ninth transistor Q9 is electrically connected to the control module and is used to receive the control signal, and a source of the ninth transistor Q9 is grounded, a positive input terminal of the third operational amplifier OP3 is electrically connected to a source of the tenth transistor Q10 and a drain of the eleventh transistor Q11, and an output terminal of the third operational amplifier OP3 is electrically connected a gate of the eleventh transistor Q11, a source of the eleventh transistor Q11 is electrically connected to the current determination module and the control module, and the first terminal of the third resistor R3 is used to output the target voltage.

Through the above apparatus, the voltage output module of the embodiment of the present disclosure can implement the voltage output based on the control signal and the input voltage introduced from the input module, so as to output a stable target voltage.

In a possible embodiment, the target voltage can be obtained according to the following formula:

Vout=Vin/(1-D), where D may represent the duty cycle of the control signal.

Therefore, by adjusting the duty cycle of the control signal, the apparatus in the embodiment of the present disclosure can quickly respond to the change of the input voltage and output the target output voltage as required.

Possible implementations of the voltage input module 10 will be introduced below. It should be understood that the following description is exemplary and should not be regarded as a limitation of the present disclosure.

In a possible embodiment, as shown in FIG. 2, the voltage input module 10 may include an input capacitor Cin and an input inductor L, wherein:

a first terminal of the input capacitor Cin is electrically connected to a first terminal of the input inductor L and is used to receive the input voltage, and a second terminal of the input capacitor Cin is grounded, and a second terminal of the input inductor L is electrically connected to the drain of the ninth transistor Q9, the drain of the eighth transistor Q8, the drain of the sixth transistor Q6, and the drain of the tenth transistor Q10.

It should be noted that although the present disclosure describes the input capacitor as an example, it should be understood that the present disclosure is not limited to this. In other embodiments, the input capacitor may be replaced with an input capacitor network composed of a plurality of capacitors, the input capacitor network may include a plurality of capacitors, and the connection relationship and the number of the capacitors are not limited in the present disclosure.

In a possible embodiment, the input inductor L may be set as or replaced with a plurality of inductors, and the connection manner of the plurality of inductors may be in series, parallel, or a combination thereof. The number of inductors included in the inductor L and the connection relationship thereof are not limited in the present disclosure.

Possible implementations of the control module 30 will be introduced below. It should be understood that the following description is exemplary and should not be regarded as a limitation of the present disclosure.

In a possible embodiment, as shown in FIG. 2, the control module 30 may include an error amplifier gm, a reference resistor Rea, a reference capacitor Cea, a comparator CMP, an oscillator, a trigger, a Pulse Width Modulation (PWM) controller, a current source Iramp, a reset switch Vreset, a capacitor Cramp, and a sampling resistor Rramp, wherein:

a positive terminal of the error amplifier gm is electrically connected between the third resistor and the fourth resistor and is used to input a feedback voltage signal Vfb of the voltage output module 40, a negative terminal of the error amplifier is used to input a reference voltage Vref, and an output terminal of the error amplifier is electrically connected to a first terminal of the reference resistor Rea and a negative terminal of the comparator CMP;

a second terminal of the reference resistor Rea is electrically connected to a first terminal of the reference capacitor Cea, and a second terminal of the reference capacitor Cea is grounded;

a positive terminal of the comparator CMP is electrically connected to the current source Iramp, a first terminal of the capacitor Cramp, and a first terminal of the reset switch, and is used to input a comparison voltage Vramp, and an output terminal of the comparator CMP is electrically connected to a first terminal R of the flip-flop;

an output terminal of the current determination module is electrically connected to a second terminal of the reset switch, a second terminal of the capacitor Cramp, and a first terminal of the sampling resistor Rramp, and is used to output the adjustment current Isink, and a second terminal of the sampling resistor Rramp is grounded;

a second terminal S of the flip-flop is electrically connected to an output terminal of the oscillator and is used to receive a clock signal CLK output by the oscillator, and an output terminal Q of the flip-flop is electrically connected to an input terminal of the PWM controller; and a first output terminal of the PWM controller is electrically connected to the gate of the ninth transistor, and a second output terminal is electrically connected to the gate of the eighth transistor, the gate of the tenth transistor, and the gate of the sixth transistor.

In a possible embodiment, the flip-flop may be configured so that:

when a high level (1) is input to the first terminal R, the output terminal Q outputs 1; and when the high level is input to the second terminal S, the output terminal Q outputs 0.

In a possible embodiment, the PWM controller may be configured so that:

when 1 is input to the input terminal, the output is 1; and when 0 is input to the input terminal, the output is 0.

Through the above apparatus, the control module of the embodiment of the present disclosure may adjust the control signal based on the adjustment current, and can reduce the fluctuation of the voltage output by the voltage output module, so that the output voltage remains stable.

In the embodiment of the present disclosure, a voltage determination module may include the current determination unit and/or a second determination unit.

In one example, the voltage determination module may also be configured to include only the current determination unit. In a possible embodiment, the voltage determination module includes the current determination unit, in a case when the input voltage increases, for example, when Vin changes by a variation of ΔVin and is input to the current determination unit, the current determination unit may determine the change of the adjustment current Isink as $\Delta Isink = gm1 * \Delta Vin$, where gm1 represents a predetermined adjustment parameter, Vin represents the input voltage, and "*" represents a multiplication operation. In this way, the initial level of Vramp changes by a component of $gm1 * \Delta Vin * Rramp$, and this change is used to ensure that the output of Vea does not change as much as possible. A case when Vref remains unchanged means that the variation of Vfb is small, that is, the change of αVout is small, thereby reducing the fluctuation of the output voltage. In this way, the voltage output module 40 can output a stable target voltage.

In this way, when the adjustment current is input to the control module, the control module can use the adjustment current to compensate for the change of the input voltage and generate the control signal to adaptively adjust the magnitude of the output voltage, so that the change fluctuation of the output voltage is small.

It should be noted that the specific value of gm1 is not limited in the embodiment of the present disclosure, which can be determined by those skilled in the art by means of simulation as required.

Figure 4:
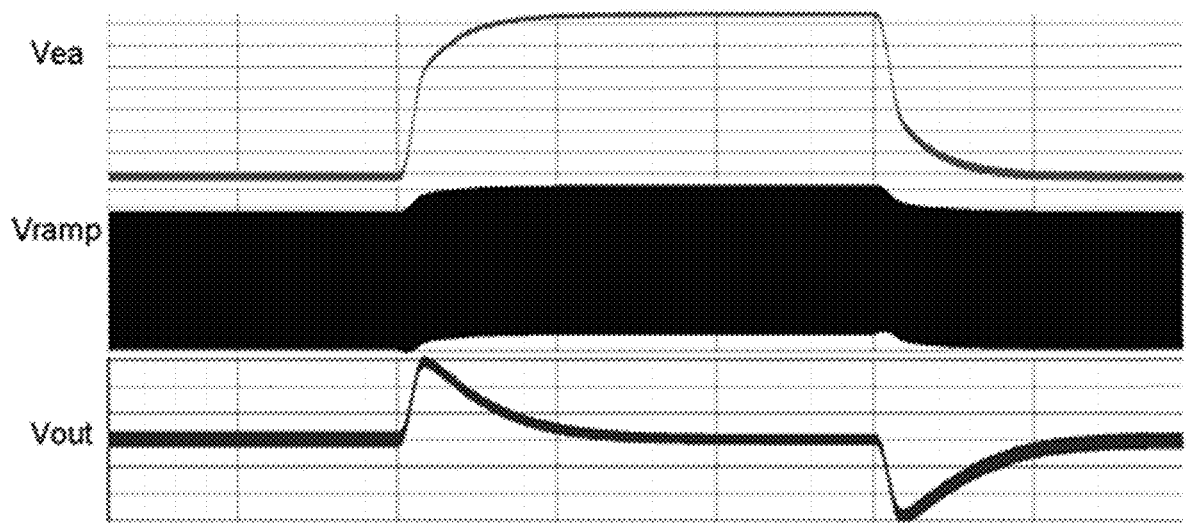
FIG. 4 shows a schematic diagram of voltage changes in the DC-DC architecture of the related art.

Please refer to FIG. 4, which shows a schematic diagram of voltage changes in the DC-DC architecture of the related art.

Figure 5:
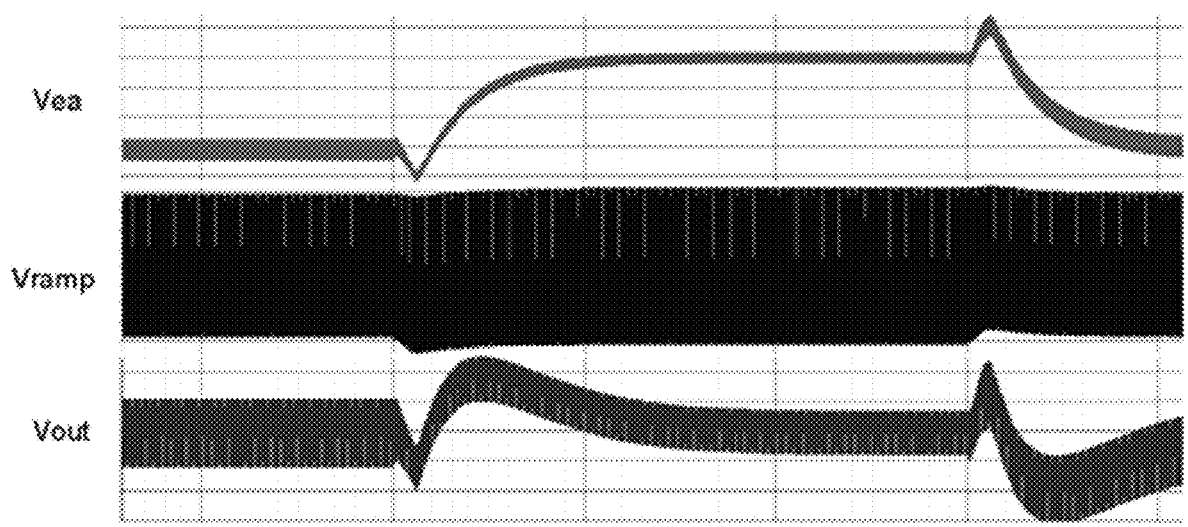
FIG. 5 shows a schematic diagram of voltage changes in a voltage regulating apparatus according to an embodiment of the present disclosure.

Please refer to FIG. 5, which shows a schematic diagram of voltage changes in a voltage regulating apparatus according to an embodiment of the present disclosure.

As shown in FIG. 4, in the related art, when the input voltage Vin changes, the change of the output voltage Vout acts on the error amplifier gm, which will affect Vea. As Vea changes more, the slower the new duty cycle D is adjusted through the loop. Therefore, the output voltage jumps up or down more with the input voltage. In this case, the peak-to-peak value of the output voltage Vout can reach 130 mV.

As shown in FIG. 5, if the current determination module includes the current determination unit, the current determination unit in the embodiment of the present disclosure determines the adjustment current to control the control module, so that the fluctuation of the output voltage can be greatly reduced, and the peak-to-peak value of the output voltage is only 30 mV.

It can be seen that, according to this solution, the change of the input voltage is well responded, and the peak-to-peak Vpp of the change of the output voltage is reduced from 130 mV to 30 mV.

In order to adapt to the change of load, the current determination module of the embodiment of the present disclosure may further include the current detection unit and the signal conversion unit. When the current detection unit detects the load current and converts it into the detection voltage, the signal conversion unit converts the detection voltage into the digital signal, and inputs the digital signal to the current determination unit. The current determination unit may determine the adjustment current based on the digital signal and the input voltage, and apply the adjustment current to the control module, so that the control module can quickly respond to change of the input voltage and adapt to different load conditions as well.

Figure 6:
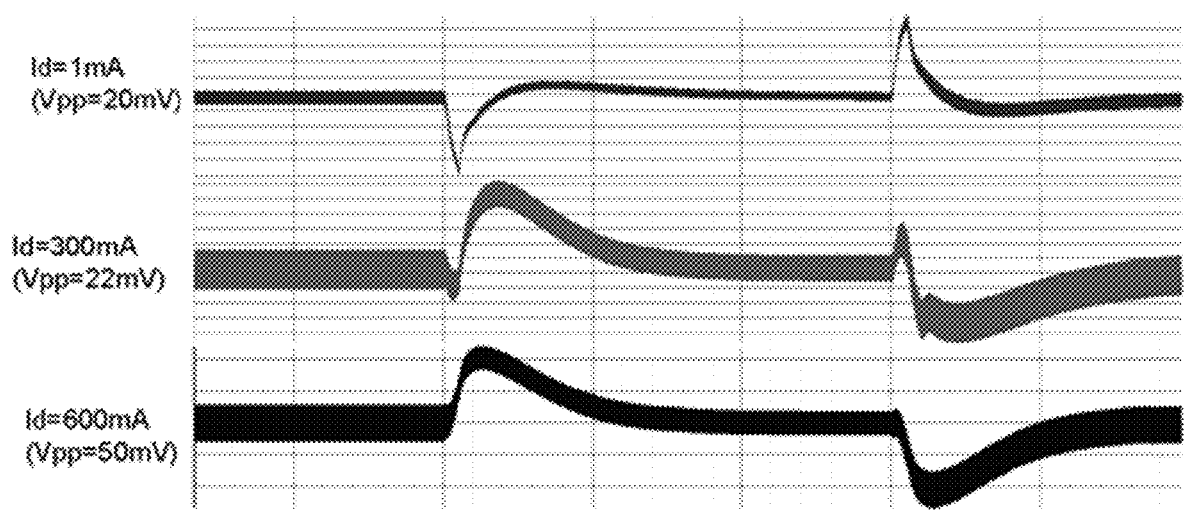
FIG. 6 shows a schematic diagram of voltage changes in a voltage regulating apparatus without being combined with load current control.

Please refer to FIG. 6, which shows a schematic diagram of voltage changes in the voltage regulating apparatus without being combined with load current control.

Figure 7:
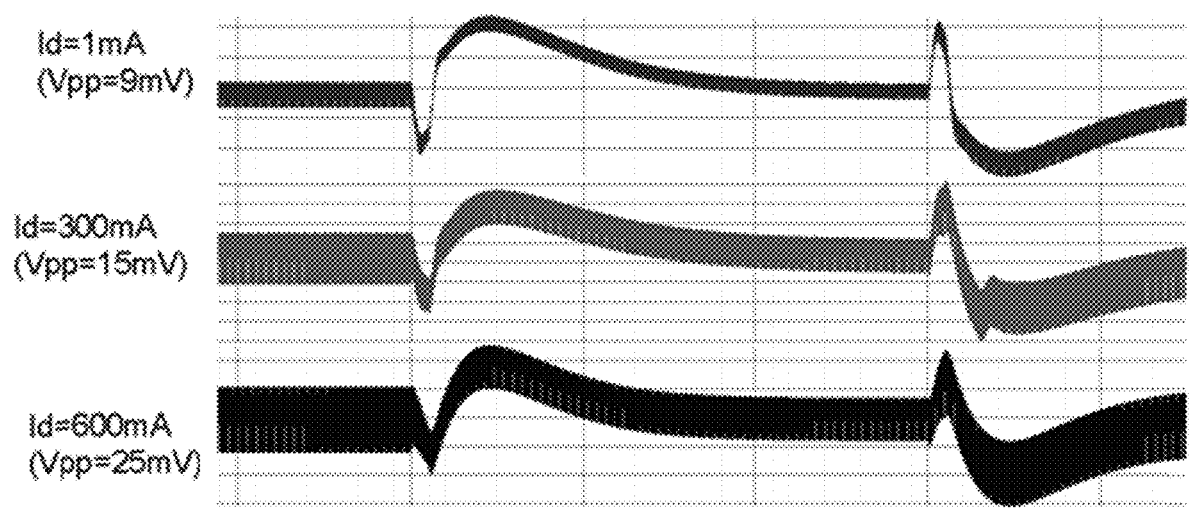
FIG. 7 shows a schematic diagram of voltage changes in a voltage regulating apparatus combined with load current control.

Please refer to FIG. 7, which shows a schematic diagram of voltage changes in the voltage regulating apparatus combined with load current control.

As shown in FIG. 6, when the current determination unit determines gm1, it is necessary to set the load in advance, so a balance point is selected between light and heavy loads, and the compensation is often insufficient or overflowing for too light or too heavy loads. Therefore, when the second determination unit is not adopted in FIG. 6 to detect the load current, the voltage regulating apparatus cannot adapt to the change of the load. When the load (the load current Id) changes, the peak-to-peak value of the output voltage change ΔVout has a relatively large fluctuation (Vpp fluctuates from 20 mV to 50 mV).

As shown in FIG. 7, by providing the current detection unit for detecting the load current and the signal conversion unit for determining the digital signal, the current determination unit determines the adjustment current through the digital signal and the input voltage, to compensate for the input of the control module, so that the voltage regulating apparatus can achieve quick response to the change of the input voltage and also provide compensation for different loads. Under different loads, the peak-to-peak value Vpp of the fluctuation section of the output voltage Vout is below 25 mV, thereby improving the environmental adaptability of the apparatus, so that the performance of the fastline excitation of the power source in the TDMA test meets the needs of SPEC and meets the TDMA test requirements of AMOLED in various application environments.

It should be understood that the selection of each element of the control module 30 and the selection of the reference voltage are not limited in the present disclosure, which can be determined by those skilled in the art as required.

Various embodiments of the present disclosure have been described above, and the above descriptions are exemplary, not exhaustive, and not limited to the disclosed embodiments. Numerous modifications and variations will be apparent to those of ordinary skill in the art without departing from the scope and spirit of the described embodiments. The selection of terms used herein aims to best explain the principles of the various embodiments, the practical application or improvement of the technology in the marketplace, or to enable others of ordinary skill in the art to understand the various embodiments disclosed herein.

What is claimed is:

1. A voltage regulating apparatus comprising:
   a voltage input module, configured to receive an input voltage;
   a current determination module that is electrically connected to the voltage input module and configured to determine an adjustment current based on the input voltage and a load current;
   a control module that is electrically connected to the current determination module and configured to output a control signal based on the adjustment current; and
   a voltage output module that is electrically connected to the voltage input module, to the current determination module, and to the control module, the voltage output module being configured to output a target voltage based on the control signal and the input voltage,
   wherein the current determination module comprises a current detection unit, a signal conversion unit, and a current determination unit,
   wherein the current detection unit is configured to determine the load current and to obtain a detection voltage based on the load current,
   wherein the signal conversion unit is electrically connected to the current detection unit and is configured to convert the detection voltage into a digital signal, and
   wherein the current determination unit is electrically connected to the signal conversion unit and is configured to determine the adjustment current based on the digital signal and the input voltage,
   wherein the current detection unit comprises a sixth transistor, a seventh transistor, a second operational amplifier, a second resistor, and a first capacitor,
   wherein a gate of the sixth transistor is used to receive the control signal, a drain of the sixth transistor is electrically connected to the voltage input module, and a source of the sixth transistor is electrically connected to a positive input terminal of the second operational amplifier and a drain of the seventh transistor;
   wherein a negative input terminal of the second operational amplifier is electrically connected to the voltage output module, an output terminal of the second operational amplifier is electrically connected to a gate of the seventh transistor, and a source of the seventh transistor is electrically connected to a first terminal of the second resistor and a first terminal of the first capacitor;
   wherein a second terminal of the second resistor and a second terminal of the first capacitor are grounded; and
   wherein the first terminal of the second resistor is used to output the detection voltage,
   wherein the voltage output module comprises an eighth transistor, a ninth transistor, a tenth transistor, an eleventh transistor, a third operational amplifier, a third resistor, a fourth resistor, and a second capacitor,
   wherein a gate of the eighth transistor is electrically connected to the gate of the sixth transistor, a gate of the tenth transistor, and the control module, and is used to receive the control signal;
   wherein a drain of the eighth transistor is electrically connected to a drain of the ninth transistor, the drain of the sixth transistor, a drain of the tenth transistor, and the voltage input module;
   wherein a source of the eighth transistor is electrically connected to a negative input terminal of the third operational amplifier, the negative input terminal of the second operational amplifier, a first terminal of the third resistor, and a first terminal of the second capacitor, a second terminal of the third resistor is electrically connected to the control module and a first terminal of the fourth resistor, a second terminal of the fourth resistor is grounded, and a second terminal of the second capacitor is grounded;

wherein a gate of the ninth transistor is electrically connected to the control module and is used to receive the control signal, and a source of the ninth transistor is grounded;

wherein a positive input terminal of the third operational amplifier is electrically connected to a source of the tenth transistor and a drain of the eleventh transistor, and an output terminal of the third operational amplifier is electrically connected a gate of the eleventh transistor;

wherein a source of the eleventh transistor is electrically connected to the current determination module and the control module; and wherein the first terminal of the third resistor is used to output the target voltage.

2. The apparatus according to claim 1, wherein the current determination unit comprises a first operational amplifier, a first transistor, a second transistor, a third transistor, a fourth transistor, a plurality of fifth transistors, a plurality of switches, and a first resistor, wherein a positive input terminal of the first operational amplifier is used to receive the input voltage, a negative input terminal of the first operational amplifier is electrically connected to a source of the first transistor and to a first terminal of the first resistor, an output terminal of the first operational amplifier is electrically connected to a gate of the first transistor, and a second terminal of the first resistor is grounded, wherein a drain of the first transistor is electrically connected to a drain of the second transistor, a gate of the second transistor, and a gate of the third transistor, wherein a source of the second transistor and a source of the third transistor are used to receive a power voltage wherein a drain of the third transistor is electrically connected to a drain of the fourth transistor, to a gate of the fourth transistor, and to gates of the plurality of fifth transistors;

wherein a source of the fourth transistor and sources of the plurality of fifth transistors are grounded;

wherein a drain of each of the plurality of fifth transistors is electrically connected to a first terminal of corresponding one of the plurality of switches, wherein control terminals of the plurality of switches are used to receive the digital signal and are turned on or off based on the digital signal; and wherein second terminals of the plurality of switches are electrically connected and are used to output the adjustment current.

3. The apparatus according to claim 2, wherein the number of bits of the digital signal is the same as the number of the switches and wherein each bit of the digital signal is used to control a conduction state of a corresponding one of the plurality of switches.

4. The apparatus according to claim 1,
wherein the voltage input module comprises an input capacitor and an input inductor,
wherein a first terminal of the input capacitor is electrically connected to a first terminal of the input inductor and is used to receive the input voltage, and a second terminal of the input capacitor is grounded, and wherein a second terminal of the input inductor is electrically connected to the drain of the ninth transistor, to the drain of the eighth transistor, to the drain of the sixth transistor, and to the drain of the tenth transistor.

5. A chip comprising:
a voltage regulating apparatus comprising:
a voltage input module that is configured to receive an input voltage;
a current determination module that is electrically connected to the voltage input module and that is configured to determine an adjustment current based on the input voltage and a load current;
a control module that is electronically connected to the current determination module and that is configured to output a control signal based on the adjustment current; and
a voltage output module that is electrically connected to the voltage input module, to the current determination module, and to the control module and that is configured to output a target voltage based on the control signal and the input voltage, wherein the current determination module comprises a current detection unit, a signal conversion unit, and a current determination unit, wherein the current detection unit is configured to determine the load current and to obtain a detection voltage based on the load current, wherein the signal conversion unit is electrically connected to the current detection unit and is configured to convert the detection voltage into a digital signal, and wherein the current determination unit is electrically connected to the signal conversion unit and is configured to determine the adjustment current based on the digital signal and the input voltage, wherein the current detection unit comprises a sixth transistor, a seventh transistor, a second operational amplifier, a second resistor, and a first capacitor, wherein a gate of the sixth transistor is used to receive the control signal, a drain of the sixth transistor is electrically connected to the voltage input module, and a source of the sixth transistor is electrically connected to a positive input terminal of the second operational amplifier and a drain of the seventh transistor;

wherein a negative input terminal of the second operational amplifier is electrically connected to the voltage output module, an output terminal of the second operational amplifier is electrically connected to a gate of the seventh transistor, and a source of the seventh transistor is electrically connected to a first terminal of the second resistor and a first terminal of the first capacitor;

wherein a second terminal of the second resistor and a second terminal of the first capacitor are grounded; and wherein the first terminal of the second resistor is used to output the detection voltage, wherein the voltage output module comprises an eighth transistor, a ninth transistor, a tenth transistor, an eleventh transistor, a third operational amplifier, a third resistor, a fourth resistor, and a second capacitor, wherein a gate of the eighth transistor is electrically connected to the gate of the sixth transistor, a gate of the tenth transistor, and the control module, and is used to receive the control signal;

wherein a drain of the eighth transistor is electrically connected to a drain of the ninth transistor, the drain of the sixth transistor, a drain of the tenth transistor, and the voltage input module;

wherein a source of the eighth transistor is electrically connected to a negative input terminal of the third operational amplifier, the negative input terminal of the second operational amplifier, a first terminal of the third resistor, and a first terminal of the second capacitor, a second terminal of the third resistor is electrically connected to the control module and a first terminal of the fourth resistor, a second terminal of the fourth resistor is grounded, and a second terminal of the second capacitor is grounded;

wherein a gate of the ninth transistor is electrically connected to the control module and is used to receive the control signal, and a source of the ninth transistor is grounded;

wherein a positive input terminal of the third operational amplifier is electrically connected to a source of the tenth transistor and a drain of the eleventh transistor, and an output terminal of the third operational amplifier is electrically connected a gate of the eleventh transistor;

wherein a source of the eleventh transistor is electrically connected to the current determination module and the control module; and wherein the first terminal of the third resistor is used to output the target voltage.

6. A power source comprising: a chip comprising a voltage regulating apparatus, wherein the voltage regulating apparatus comprises:
a voltage input module that is configured to receive an input voltage;
a current determination module that is electrically connected to the voltage input module and that is configured to determine an adjustment current based on the input voltage and a load current;
a control module that is electrically connected to the current determination module and that is configured to output a control signal based on the adjustment current;
a voltage output module that is electrically connected to the voltage input module, to the current determination module, and to the control module, the voltage output module being configured to output a target voltage based on the control signal and the input voltage,
wherein the current determination module comprises a current detection unit, a signal conversion unit, and a current determination unit,
wherein the current detection unit is configured to determine the load current and to obtain a detection voltage based on the load current,
wherein the signal conversion unit is electrically connected to the current detection unit and is configured to convert the detection voltage into a digital signal, and
wherein the current determination unit is electrically connected to the signal conversion unit and is configured to determine the adjustment current based on the digital signal and the input voltage,
wherein the current detection unit comprises a sixth transistor, a seventh transistor, a second operational amplifier, a second resistor, and a first capacitor,
wherein a gate of the sixth transistor is used to receive the control signal, a drain of the sixth transistor is electrically connected to the voltage input module, and a source of the sixth transistor is electrically connected to a positive input terminal of the second operational amplifier and a drain of the seventh transistor;
wherein a negative input terminal of the second operational amplifier is electrically connected to the voltage output module, an output terminal of the second operational amplifier is electrically connected to a gate of the seventh transistor, and a source of the seventh transistor is electrically connected to a first terminal of the second resistor and a first terminal of the first capacitor;
wherein a second terminal of the second resistor and a second terminal of the first capacitor are grounded; and
wherein the first terminal of the second resistor is used to output the detection voltage,
wherein the voltage output module comprises an eighth transistor, a ninth transistor, a tenth transistor, an eleventh transistor, a third operational amplifier, a third resistor, a fourth resistor, and a second capacitor,
wherein a gate of the eighth transistor is electrically connected to the gate of the sixth transistor, a gate of the tenth transistor, and the control module, and is used to receive the control signal;
wherein a drain of the eighth transistor is electrically connected to a drain of the ninth transistor, the drain of the sixth transistor, a drain of the tenth transistor, and the voltage input module;
wherein a source of the eighth transistor is electrically connected to a negative input terminal of the third operational amplifier, the negative input terminal of the second operational amplifier, a first terminal of the third resistor, and a first terminal of the second capacitor, a second terminal of the third resistor is electrically connected to the control module and a first terminal of the fourth resistor, a second terminal of the fourth resistor is grounded, and a second terminal of the second capacitor is grounded;
wherein a gate of the ninth transistor is electrically connected to the control module and is used to receive the control signal, and a source of the ninth transistor is grounded;
wherein a positive input terminal of the third operational amplifier is electrically connected to a source of the tenth transistor and a drain of the eleventh transistor, and an output terminal of the third operational amplifier is electrically connected a gate of the eleventh transistor;
wherein a source of the eleventh transistor is electrically connected to the current determination module and the control module; and
wherein the first terminal of the third resistor is used to output the target voltage.

7. An electronic device comprising: a power source comprising a chip, wherein the chip comprises a voltage regulating apparatus that comprises:
a voltage input module that is configured to receive an input voltage;
a current determination module that is electrically connected to the voltage input module and that is configured to determine an adjustment current based on the input voltage and a load current;
a control module electrically that is connected to the current determination module, the control module being configured to output a control signal based on the adjustment current;
a voltage output module that is electrically connected to the voltage input module, to the current determination module, and to the control module, wherein the voltage output module is configured to output a target voltage based on the control signal and the input voltage, wherein the current determination module comprises a current detection unit, a signal conversion unit, and a current determination unit, wherein the current detection unit is configured to determine the load current and to obtain a detection voltage based on the load current, wherein the signal conversion unit is electrically connected to the current detection unit and is configured to convert the detection voltage into a digital signal, and wherein the current determination unit is electrically connected to the signal conversion unit and is configured to determine the adjustment current based on the digital signal and the input voltage, wherein the current detection unit comprises a sixth transistor, a seventh transistor, a second operational amplifier, a second resistor, and a first capacitor, wherein a gate of the sixth transistor is used to receive the control signal, a drain of the sixth transistor is electrically connected to the voltage input module, and a source of the sixth transistor is electrically connected to a positive input terminal of the second operational amplifier and a drain of the seventh transistor;

wherein a negative input terminal of the second operational amplifier is electrically connected to the voltage output module, an output terminal of the second operational amplifier is electrically connected to a gate of the seventh transistor, and a source of the seventh transistor is electrically connected to a first terminal of the second resistor and a first terminal of the first capacitor;

wherein a second terminal of the second resistor and a second terminal of the first capacitor are grounded; and wherein the first terminal of the second resistor is used to output the detection voltage, wherein the voltage output module comprises an eighth transistor, a ninth transistor, a tenth transistor, an eleventh transistor, a third operational amplifier, a third resistor, a fourth resistor, and a second capacitor, wherein a gate of the eighth transistor is electrically connected to the gate of the sixth transistor, a gate of the tenth transistor, and the control module, and is used to receive the control signal;

wherein a drain of the eighth transistor is electrically connected to a drain of the ninth transistor, the drain of the sixth transistor, a drain of the tenth transistor, and the voltage input module;

wherein a source of the eighth transistor is electrically connected to a negative input terminal of the third operational amplifier, the negative input terminal of the second operational amplifier, a first terminal of the third resistor, and a first terminal of the second capacitor, a second terminal of the third resistor is electrically connected to the control module and a first terminal of the fourth resistor, a second terminal of the fourth resistor is grounded, and a second terminal of the second capacitor is grounded;

wherein a gate of the ninth transistor is electrically connected to the control module and is used to receive the control signal, and a source of the ninth transistor is grounded;

wherein a positive input terminal of the third operational amplifier is electrically connected to a source of the tenth transistor and a drain of the eleventh transistor, and an output terminal of the third operational amplifier is electrically connected a gate of the eleventh transistor;

wherein a source of the eleventh transistor is electrically connected to the current determination module and the control module; and wherein the first terminal of the third resistor is used to output the target voltage.

8. The electronic device according to claim 7, wherein the electronic device is selected from the group consisting of a display, a smartphone, and a portable device.

* * * * *